United States Patent [19]

Evans et al.

[11] Patent Number: 4,903,023
[45] Date of Patent: Feb. 20, 1990

[54] SUBRANGING ANALOG-TO-DIGITAL CONVERTER WITH DIGITAL ERROR CORRECTION

[75] Inventors: William P. Evans, Glen Burnie; Eric H. Naviasky, Catonsville, both of Md.

[73] Assignee: Westinghouse Electric Corp., Pittsburgh, Pa.

[21] Appl. No.: 174,253

[22] Filed: Mar. 28, 1988

Related U.S. Application Data

[63] Continuation of Ser. No. 795,397, Nov. 6, 1985, abandoned.

[51] Int. Cl.$^4$ .............................................. H03M 1/10
[52] U.S. Cl. .................................... 341/120; 341/118; 341/155; 364/571.05
[58] Field of Search ................. 340/347 CC, 347 AD, 340/347 M; 364/576, 827, 571.01, 571.02, 571.04, 571.05; 341/110, 118, 120, 122, 141, 155, 156, 158

[56] References Cited

U.S. PATENT DOCUMENTS

| | | | |
|---|---|---|---|
| 3,541,315 | 11/1970 | Naydan et al. | 340/347 M X |
| 4,315,254 | 2/1982 | Honjyo et al. | 340/347 AD X |
| 4,544,917 | 10/1985 | Lenhoff | 341/158 |
| 4,612,533 | 9/1986 | Evans | 341/120 |
| 4,733,217 | 3/1988 | Dingwall | 341/122 |
| 4,804,960 | 2/1989 | Fernandes et al. | 341/158 |
| 4,814,767 | 3/1989 | Fernandes et al. | 341/158 |

FOREIGN PATENT DOCUMENTS 54-58341 11/1979 Japan ............................ 340/347 CC

OTHER PUBLICATIONS

The Engineering Staff of Analog Devices, Inc., Analog-Digital Conversion Handbook, 6/1972, pp. I-54 to I-59, II-64 and II-65; III-80 to III-83.

*Primary Examiner*—William M. Shoop, Jr.
*Assistant Examiner*—Brian K. Young
*Attorney, Agent, or Firm*—W. G. Sutcliff

[57] ABSTRACT

An analog-to-digital converter having error correction in the digital stages of the converter. A calibration microprocessor executes a correction value program prior to, or interspaced with, the normal operation of the converter. From either of two calibration programs, appropriate digital correction values are stored into a digital memory. The analog input signal is converted to a digital signal by a main range analog-to-digital converter, with the output of the converter addressing the memory containing the error correction values. The main range digital value is reconverted to an analog signal which is compared to the original input signal to determine the difference therebetween. This analog difference is converted to a digital signal and combined with the main range digital signal and the addressed correction values to produce the digital output signal of the conversion system.

17 Claims, 2 Drawing Sheets

SUBRANGING ANALOG-TO-DIGITAL CONVERTER WITH DIGITAL ERROR CORRECTION

LICENSE RIGHTS

The U.S. Government has a paid-up license in this invention and the right in limited circumstances to require the patent owner to license others on reasonable terms as provided for by the terms of Contract F19628-80-C-0007 by the Department of the Air Force.

This application is a continuation of application Ser. No. 795,397 filed Nov. 6, 1985, abandoned.

BACKGROUND OF THE INVENTION

This invention relates, in general, to electronic circuit devices and, more specifically, to subranging analog-to-digital converters.

There is always a need for higher speed and higher accuracy analog-to-digital converters and there is usually a continuing design effort being undertaken to achieve these goals. Several different techniques have evolved which have exhibited good economic and performance characteristics for analog-to-digital converters. A popular technique employs the use of digitally corrected subranging converters. Background information on such converters is contained in various publications, such as in Pratt, W.J.: High Linearity and Video Speed Come Together In A-D Converters, "Electronics," McGraw-Hill, Inc., Oct. 9, 1980.

Although analog-to-digital converters constructed according to the above reference are useful in certain applications, limitations on the speed and accuracy of the required digital-to-analog converter used in the subranging system has slowed the rate of advancement of the speed and resolution of the overall subranging analog-to-digital architecture. Therefore, various attempts to provide analog-to-digital converters using the basic subranging architecture and improving the performance thereof have been proposed by others.

One method of improving the performance of conventional subranging A/D converters is disclosed in U.S. Pat. No. 4,612,533 issued Sept. 16, 1986, which discloses an invention made by one of the inventors of the present application and is assigned to the Secretary of the Air Force. The system disclosed therein uses two high speed, low accuracy, digital-to-analog converters in the analog-to-digital conversion system. One of the digital-to-analog converters is used to provide a correction to the other digital-to-analog converter. This correction is made in the analog stages of the system which, because of its analog nature, does not readily permit the implementation of that invention with CMOS, gate array, or VHSIC technology.

Therefore, it is desirable, and it is an object of this invention, to provide a high speed analog-to-digital converter which requires a minimum of high speed, high accuracy analog components, thereby allowing implementation with the newest high speed, low power digital techniques.

SUMMARY OF THE INVENTION

There are disclosed herein new and useful systems and methods for converting analog input signals into digital values. Internal converter correction values are used in the digital portion of the circuitry, thereby minimizing the amount of analog components and circuits in the converter architecture. According to one embodiment of the invention, the analog signal to be converted is first converted to digital values and then reconverted to an analog signal. The digital values are applied to a digital combiner and also to a digital correction circuit which provides digital correction values to the digital combiner. The reconverted analog signal is compared to the original analog signal to determine the difference between the two signals. This difference is applied to an analog-to-digital converter and the digital values resulting therefrom are applied to the digital combiner. The three values applied to the digital combiner form the digital output of the overall analog-to-digital system.

The digital correction circuitry consists of a digital memory which has correction values stored therein which were determined by a previous calibration process. The calibration process is controlled by a microprocessor which applies known signals to the input of the analog-to-digital conversion system. These known signals may be applied, for calibration purposes, either before the analog-to-digital converter is put into operation or periodically throughout the operation of the analog-to-digital converter.

According to one embodiment of the invention, the digital combiner uses a linearity correction adder to add together the correction values and the digital values representing the differences between the original signal and the analog signal reconverted from the first analog-to-digital conversion. The output of the linearity correction adder is combined with the output of a bit overlap adder to which the original digital value converted from the applied analog signal is applied. According to another embodiment of the invention, the digital correction values from the digital memory are added by a linearity correction adder to the sum, provided by a bit overlap adder, of the first conversion digital values and the difference values. Both embodiments of the invention employ a digital memory with correction values which are added to the converted signal after it has been changed into digital form.

BRIEF DESCRIPTION OF THE DRAWINGS

Further advantages and uses of this invention will become more apparent when considered in view of the following detailed description and drawings, in which.

DESCRIPTION OF THE PREFERRED EMBODIMENTS

Figure 1:
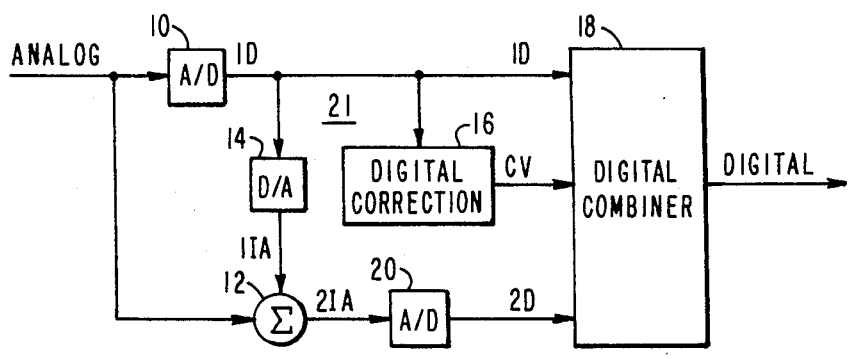
FIG. 1 is a block diagram illustrating the overall arrangement of components of an analog-to-digital converter constructed according to this invention.

Throughout the following description, similar reference characters refer to similar elements or members in all of the figures of the drawings Referring now to the drawings, and to FIG. 1 in particular, there is shown an analog-to-digital conversion system constructed according to this invention. The analog signal to be converted is applied to the analog-to-digital converter 10 and also to the difference circuit 12. The converter 10 provides a first digital value (1D) which is applied to the digital-to-analog converter 14, the digital correction circuitry 16, and the digital combiner 18. The converter 14 changes the first digital signal from the converter 10 back into a first intermediate analog signal (1IA) which is equal to the original analog input signal except for any residue or unquantitized portion of the original signal plus any errors resulting from the converters 10 and 14.

The difference between the reconverted analog signal applied to the difference circuit 12 and the original analog input signal becomes the second intermediate analog signal (2IA) which is applied to the analog-to-digital converter 20. The output of the converter 20, which is the second digital signal (2D) existing within the converter circuitry, is applied to the digital combiner 18. The converter 10 is sometimes referred to as the main range A/D converter, and the converter 20 is sometimes referred to as the subrange A/D converter.

The first digital signal (1D) is applied to the digital combiner 18 and to the digital correction circuitry 16. This digital signal acts as an address to the digital correction circuitry 16, which may consist of a digital memory. Correction values (CV) contained within the digital memory are applied to the digital combiner 18. The digital combiner 18 combines or adds together the two digital values and the one correction value to form the overall digital output of the analog-to-digital converter 21.

Figure 2:
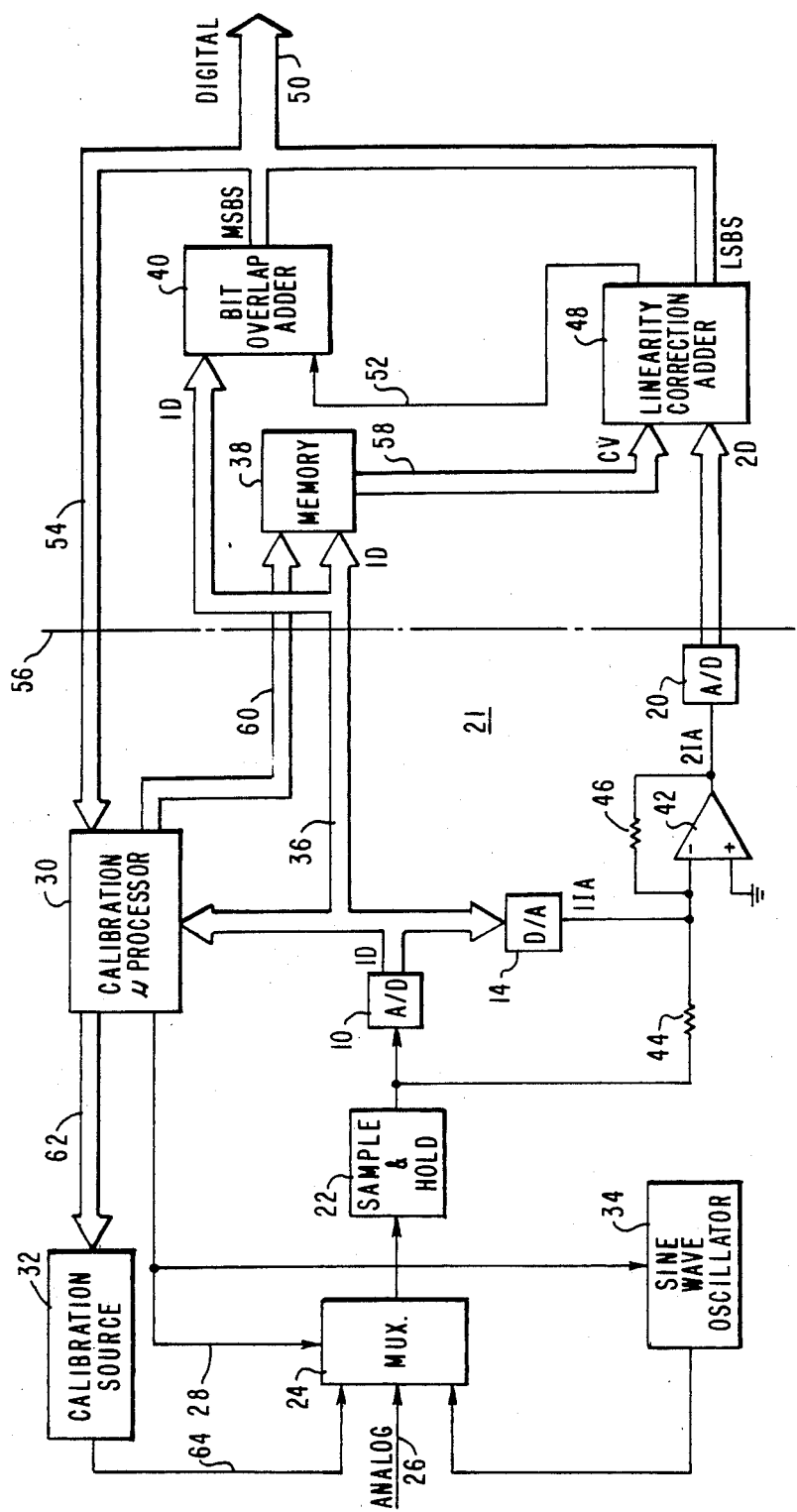
FIG. 2 is a diagram illustrating, in detail, the specific component relationships of one embodiment of the invention.

FIG. 2 is a more detailed representation of the converter shown in FIG. 1. As shown in FIG. 2, the converters 10, 14 and 20 are similar to the corresponding converters shown in FIG. 1. These converters can be of the parallel (flash) type, or other conventional type. The input signal to the converter 10 comes from the sample and hold circuit 22, which receives its signal from the multiplexer 24. The analog input signal 26 is applied to the multiplexer 24 and, when the multiplexer is properly controlled through control line 28 from the calibration microprocessor 30, the input signal 26 is switched or passed to the sample and hold circuit 22. Depending on the function being performed by the converter 21, the calibration microprocessor 30 can control the input to the converter, by control of the multiplexer 24, so that signals from the calibration source 32 or the sine wave generator 34 will be applied to the sample and hold circuit 22.

Assuming, for purposes of this explanation, that the calibration has already taken place, the microprocessor 30 would control the multiplexer 24 such that the analog input signal 26 would be applied to the sample and hold circuit 22, which supplies a discrete value of the input signal to the analog-to-digital converter 10. The first digital value from the converter 10 is transferred across bus 36 to the converter 14, the calibration microprocessor 30, the memory 38, and the bit overlap adder 40. The digital information supplied to the microprocessor 30 is used during the calibration process for determining the value of the first digital signal, which value is also used as an address for the memory 38.

The digital-to-analog converter 14 reconverts the first digital signal, or value, back into an analog signal, denoted as the first intermediate analog signal (1IA). This intermediate analog signal is applied to the difference stage consisting of the operational amplifier 42, and the resistors 44 and 46. Since the original sampled and held analog signal from circuit 22 is also applied, through resistor 44, to the operational amplifier 42, the output of the operational amplifier 42 is proportional to the difference between the original analog signal 26 and the first intermediate analog signal (1IA). This output is, for descriptive purposes, indicated as the second intermediate analog signal (2IA), and is applied to the analog-to-digital converter 20.

Thus far, the original analog input signal 26 has been changed into two digital values, 1D and 2D, which are applied to the memory 38 and to the linearity correction adder 48, respectively. The 2D value would represent the difference between the 1D value and the desired or correct digital representation of the analog input signal if there were no errors in the digital converters within the converter system 21. However, since all such converters experience some error in their operation, the correction value (CV) is digitally added to the other digital values, according to this invention, in order to obtain a more precise overall digital output value.

It is emphasized that the digital quantities discussed herein are discrete digital values which represent a sampled value of a continuous analog input signal. Since the analog-to-digital converter 21 of this system would ordinarily be sampling the input signal at a fast rate and providing discrete digital output values at this high rate, it is sometimes convenient to regard the digital output quantities as a digital output signal. It is intended that the teachings of this invention are applicable to an analog-to-digital conversion system which continuously and frequently outputs digital values to form a digital output signal. Similarly, where a digital signal is described, it may be more accurately regarded as a series of digital output values occurring sequentially in time. In some portions of this description, it is more appropriate to describe the invention by specifying the conversion of a single digital value although usual operation would use many of such values.

The linearity correction adder 48 is a binary adder which combines the correction value and the second digital value to provide the least significant bits (LSBS) of the digital output signal, or value, 50. The most significant bit of the linearity correction adder 48 is applied to the bit overlap adder 40, which is also a binary adder. The most significant bit from the adder 48, represented by the line 52, is combined with the first digital value to provide the most significant bits (MSBS) of the digital output signal 50. The combined bits of the digital output signal 50 are conveyed back to the calibration microprocessor 30 by the bus 54. In effect, the digital combining circuitry to the right of line 56 shown in FIG. 2, adds the error correction value to the digital difference value, and combines the total with the first digital value to provide the overall output of the analog-to-digital conversion system.

Figure 3:
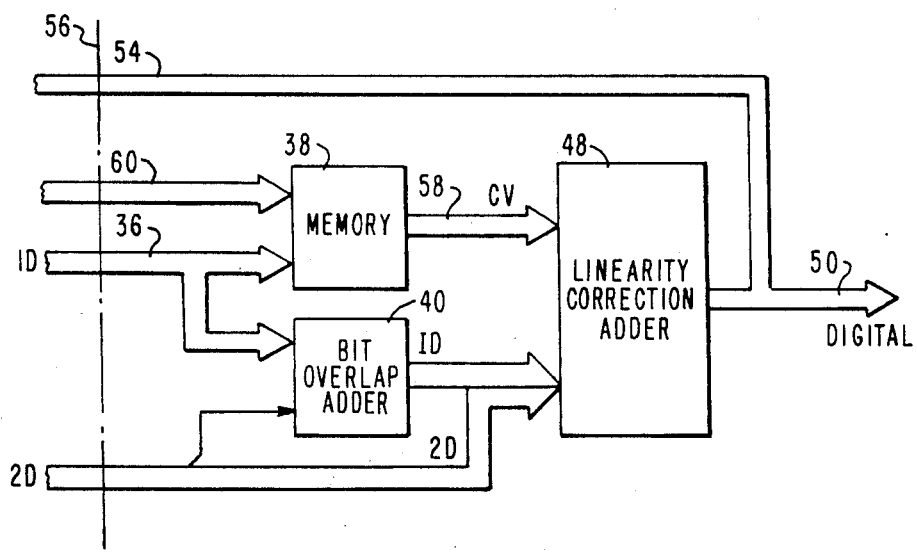
FIG. 3 is a partial diagram illustrating, in detail, how the converter shown in FIG. 2 can be modified according to another embodiment of the invention.

FIG. 3 is a partial diagram illustrating how the circuitry of FIG. 2 may be modified to combine the digital values in another manner. According to FIG. 3, the first and second digital values from the conversion circuitry are combined by the bit overlap adder 40 before the correction value is added thereto by the linear correction adder 48. The resulting digital output 50 is similarly transferred through bus 54 back to the calibration microprocessor 30. When only a small linearity correction is expected, the architecture shown in FIG. 2 is preferred. When the linearity correction is expected to be a larger fraction of the quantitization level of the analog-to-digital converter 10, the architecture shown in FIG. 3 allows for a larger range of correction values, and is the preferred arrangement.

The digital memory 38 can be any one of the usual digital memory types, such as RAM, ROM, EPROM, or EAROM. Regardless of the type of digital memory, the values stored at the address locations in the memory are, when addressed by the first digital value from bus 36, available to the digital correction value bus 58. The bus 60 between the microprocessor 30 and the memory 38 is used during the process of storing the appropriate values into the memory 38 when the calibration is being performed.

Two types of calibration processes may be used to determine and store the correction values into the memory 38. When the digital output is to have low harmonic distortion characteristics, the process for determining the appropriate correction values makes use of the sine wave oscillator 34. In such a process, the sine wave oscillator 34 is connected by the multiplexer circuit 24, under control of the calibration microprocessor 30, to the input of the digital conversion system. The processor performs a fast Fourier transform on the digital output signal 50 and, from the harmonics measured, determines the correction values which should be stored in the memory 38. This is usually accomplished before the conversion system is required to perform the functions of analog-to-digital conversion. However, such calibration sequences can be performed intermittently during the course of converting a signal to digital values, thereby keeping the calibration values, or correction values, accurate even with changes in operating parameters of the circuit components. A more in depth discussion and description of the harmonic distortion reduction technique provided by the correction values determined in this manner is contained in the referenced patent application.

When differential linearity of the output signal is the primary concern, the calibration process makes use of the calibration source 32. The source 32 can be a highly accurate digital-to-analog converter which is controlled by digital signals over bus 62 from the microprocessor 30. When this calibration technique is used, the microprocessor 30 sends out the appropriate signals to the calibration source 32 to step it through the dynamic range of the conversion system 21. As the precise calibration signal 64 is applied to the conversion system, the microprocessor determines the correction value needed to make the actual output of the conversion system equal to the input signal 64. This is done for each discrete value of the first digital signal (lD) which is available on bus 36 to the microprocessor 30. Therefore, a correction value for each discrete value of the quantity on bus 36 is determined for storage into the memory 38. Consequently, during normal operation of the conversion system, the calibration microprocessor 30 will not be controlling the operation of the converter, and each difference value on the bus 36 selects a corresponding address in memory 38 to obtain a correction value for modifying the digital output signal.

Instead of writing just the correction values into the digital memory and later adding it to the first or main range digital value, the sum of the correction and main range values may be stored in the memory. This eliminates the need for one stage of adders. However, a wider memory is required to store all of the bits necessary to represent the correction value plus the main range value.

Since the various converters within the conversion system, such as converters 10, 14 and 20 shown in FIG. 2, are converting only a part of the original analog input signal, their bit resolution need not be as great as the overall resolution or accuracy of the converter system. For example, in the embodiment shown in FIG. 2, the analogto-digital converter 10 may have a bit resolution of five bits, the digital-to-analog converter 14 may have an accuracy which is less than the 12-bit output accuracy, and the analog-to-digital converter 20 may have a bit resolution of seven bits. The calibration source 32, which is used during the determination of the correction values for memory 38, could be a 16-bit low speed, high accuracy digital-to-analog converter. Normally, the number of bits to which the overall converter is accurate equals the sum of the number of bits of the analog-to-digital converter 10 plus one less than the bit accuracy of the analog-to-digital converter 20. One bit is subtracted in order to "overlap" one bit in the combining system.

Using the techniques disclosed herein allow the use of digital components to apply the correction values to the uncorrected digital output values In addition to these more convenient arrangements for implementing the digital combining with current digital technology, the digital-to-analog converter 14, shown in FIG. 2, can be a low speed, high accuracy converter without detracting from the system performance. The invention uses digital circuitry to correct for analog inaccuracies in the analog components of a subranging analog-to-digital converter.

It is emphasized that numerous changes may be made in the above described system without departing from the teachings of the invention. It is intended that all of the matter contained in the foregoing description, or shown in the accompanying drawings, shall be interpreted as illustrative rather than limiting.

We claim as our invention:

1. An analog-to-digital conversion system for converting an analog input signal into corresponding digital output values, said conversion system comprising:
   first means for converting an instantaneous value of the analog input signal into a first digital value;
   second means for converting said first digital value into a first intermediate analog value;
   difference means for providing a second intermediate analog value which is responsive to the difference between said instantaneous value of the analog input signal and the first intermediate analog value;
   third means for converting said second intermediate analog value into a second digital value;
   correction means for providing a predetermined correction value responsive to said first digital value, said correction means including a digital memory addressed by said first digital value, with the provided correction value being stored at the memory position being addressed; and
   combining means for digitally combining said first and second digital values and said correction value to provide a digital output value.

2. The conversion system of claim 1 wherein the system components are controlled to convert a plurality of sequentially sampled analog input values into a plurality of corresponding digital output values.

3. The conversion system of claim 1 wherein a plurality of correction values are stored into the cells of the memory by a calibration process executed prior to the analog-to-digital operation of the system upon the analog input signal.

4. The conversion system of claim 1 wherein a plurality of correction values are stored into the cells of the memory by a calibration process executed at periodic times interspaced with the analog-to-digital operation of the system upon the analog input signal.

5. The conversion system of claim 1 wherein the combining means includes:
- a linearity correction adder to which the second digital value and the correction value are applied to produce the least significant bits of the digital output value; and
- a bit overlap adder to which the first digital value and the most significant bit of the linearity correction adder output are applied to produce the most significant bits of the digital output value of the system.

6. The conversion system of claim 1 wherein the combining means includes:
- a bit overlap adder to which the first digital value and the most significant bit of the second digital value are applied to produce an intermediate digital output; and
- a linearity correction adder to which said intermediate digital output, said second digital value, and said correction value are applied to produce the digital output value of the system.

7. The conversion system of claim 1 wherein the correction means includes a microprocessor and a digital-to-analog converter which generates a calibration signal under control of the microprocessor for application to the input of the conversion system.

8. The conversion system of claim 1 wherein the correction means includes a microprocessor and a sine wave generator which is controlled by the microprocessor to provide a sine wave input signal to the conversion system.

9. The conversion system of claim 1 including a multiplex circuit for selectively switching the input of the conversion system between the analog input signal and a signal generated by the correction means.

10. The conversion system of claim 1 wherein the first converting means includes a sample and hold circuit to which the analog input signal is applied, and an analog-to-digital converter to which is applied the signal held by said sample and hold circuit, said analog-to-digital converter having a bit resolution which is less than the bit resolution of the overall conversion system.

11. The conversion system of claim 1 wherein the second converting means includes a digital-to-analog converter having a bit resolution which is less than the bit resolution of the overall conversion system.

12. The conversion system of claim 1 wherein the third converting means includes an analog-to-digital converter having a bit resolution which is less than the bit resolution of the overall conversion system.

13. The conversion system of claim 1 wherein the correction value stored in the digital memory was derived by executing a conversion by the system of a digitally controlled calibrating input value and measuring the amount of correction needed, when said first digital value is addressing the stored correction value, to make the system digital output value equal to a digital value which controls the calibrated input value.

14. The conversion system of claim 1 wherein the correction value stored in the digital memory was derived by executing a conversion by the system of a sine wave input signal, performing a fast Fourier transform of the system converted output signal, analyzing the harmonics in the output signal, and determining what value is needed, when said first digital value is addressing the stored correction value, to make the output signal have the lowest harmonic content.

15. An analog-to-digital conversion system converting an analog input signal into corresponding digital output values, said conversion system comprising:
- a microprocessor (30);
- a multiplex circuit (24) for applying either a calibration signal (32, 34) or the analog input signal (26) to the conversion system, said multiplex circuit being under the control of said microprocessor;
- a sample and hold circuit (22) to which the signal from said multiplex circuit is applied;
- a first analog-to-digital converter (10) for converting the signal held by said sample and hold circuit to a first digital signal (1D);
- a first digital-to-analog converter (14) to which said first digital signal is applied;
- a digital memory (38) addressed by said first digital signal, said memory outputting predetermined correction values (CV);
- a difference circuit (42, 44, 46) for providing an intermediate analog signal (2IA) which is equal to the difference between the sampled and held input signal and the output (1IA) of said first digital-to-analog converter;
- a second analog-to-digital converter (20) which converts said intermediate analog signal (2IA) into a second digital signal (2D); and
- means for combining correction values from the digital memory with the first and second digital signals to provide the system digital output values (50);
- said correction values being determined, under control of the microprocessor, by applying the calibration signal to the conversion system and noting the correct instantaneous value needed to give the desired output when the first digital signal is addressing the stored correction value.

16. A method for converting an analog input signal into a digital output signal, said method including the steps of:
- converting the analog input signal to a first digital signal;
- converting the first digital signal to a first intermediate analog signal;
- determining the difference between the input signal and the first intermediate analog signal to provide an analog difference signal;
- converting the analog difference signal into a second digital signal;
- addressing a digital memory, containing predetermined digital correction values, with said first digital signal; and
- digitally combining the addresses digital correction values provided by said memory with said first and second digital signals to provide said digital output signal.

17. The method of claim 18 including the additional steps of:
- converting a digitally controlled analog calibration signal to a digital output signal;
- providing an error signal responsive to the difference between the digital output signal and the digital signal which controls the analog calibration signal; and determining the correction values which must be placed into the digital memory to yield the smallest error signal when the addressed values in the memory are combined with the first and second digital signals.

* * * * *